United States Patent

Bunyan et al.

Patent Number: 5,641,438
Date of Patent: Jun. 24, 1997

[54] METHOD FOR FORMING AN EMI SHIELDING GASKET

[76] Inventors: Michael H. Bunyan, 21 Essex Pl.; John P. Kalinoski, 145 Park Rd., both of Chelmsford, Mass. 01824; Russell T. Lucia, 42 Westwood Rd., Stoneham, Mass. 02180; Paul R. Vilandre, 37 Bluff St., Salem, N.H. 03079; George R. Watchko, 24 Keene St., Stoneham, Mass. 02180; Rudolf I. Shvartsman, 4 Chango Dr., Ballston Lake, N.Y. 12019; John E. Soron, 1323 Fox Hollow Rd., Niskayuna, N.Y. 12309-2507

[21] Appl. No.: 377,412

[22] Filed: Jan. 24, 1995

[51] Int. Cl.$^6$ .................................................. C04B 35/00
[52] U.S. Cl. ................ 264/40.3; 264/40.1; 264/40.7; 264/104
[58] Field of Search ................... 264/40.1, 40.3, 264/40.7, 104, 268, 323, 570; 425/132, 149, DIG. 16, DIG. 47; 156/500

[56] References Cited

U.S. PATENT DOCUMENTS

| | | | |
|---|---|---|---|
| 2,796,457 | 6/1957 | Stinger . | |
| 3,032,528 | 5/1962 | Nitzsche et al. . | |
| 3,126,440 | 3/1964 | Goodloe . | |
| 3,140,342 | 7/1964 | Ehrreich et al. . | |
| 3,752,899 | 8/1973 | Bakker | 161/164 |
| 3,880,627 | 4/1975 | Morton | 55/499 |
| 3,889,043 | 6/1975 | Ducros | 174/35 GC |
| 4,011,360 | 3/1977 | Walsh | 428/402 |
| 4,037,009 | 7/1977 | Severinsen | 428/241 |
| 4,295,573 | 10/1981 | Terry et al. | 215/348 |
| 4,434,541 | 3/1984 | Powers, Jr. | 428/328 |
| 4,507,359 | 3/1985 | Powers, Jr. | 29/526 R |
| 4,643,863 | 2/1987 | Martini | 264/219 |
| 4,643,864 | 2/1987 | Martini | 264/220 |
| 4,643,924 | 2/1987 | Uken et al. | 428/35 |
| 4,664,971 | 5/1987 | Soens | 428/288 |
| 4,678,716 | 7/1987 | Tzeng | 428/551 |
| 4,678,863 | 7/1987 | Reese et al. | 174/35 GC |
| 4,690,831 | 9/1987 | Uken et al. | 427/44 |
| 4,734,140 | 3/1988 | Tzeng | 148/126.1 |
| 4,769,280 | 9/1988 | Powers, Jr. | 428/328 |
| 4,779,762 | 10/1988 | Klein et al. | 222/52 |
| 4,857,668 | 8/1989 | Buonanno | 174/35 GC |

(List continued on next page.)

FOREIGN PATENT DOCUMENTS

| | | |
|---|---|---|
| 1116650 | 1/1982 | Canada . |
| 0182391 | 5/1986 | European Pat. Off. . |
| 0194230 | 9/1986 | European Pat. Off. . |
| 0200296 | 12/1986 | European Pat. Off. . |
| 0241192 | 10/1987 | European Pat. Off. . |
| 0326704 | 8/1989 | European Pat. Off. . |
| 0588321 | 3/1994 | European Pat. Off. . |
| 2480488 | 10/1981 | France . |
| 89123972 | 1/1990 | Germany . |
| 4219915 | 12/1993 | Germany . |
| 4237217 | 5/1994 | Germany . |
| 94042918 | 7/1994 | Germany . |
| 2115084 | 9/1983 | United Kingdom . |

OTHER PUBLICATIONS

DYNAFOAM™ Technical Guide, Mar., 1992.
King, G.D., SAE Technical Paper Series, "Improved Foam In Place Gasketing Material", 02/26–03/02/90.
Chomerics Technical Bulletin 46, (1 page) 1987.
Chomerics Technical Bulletin E46, (1 page) 1990.

*Primary Examiner*—Christopher A. Fiorilla
*Attorney, Agent, or Firm*—Wolf, Greenfield & Sacks, P.C.

[57] ABSTRACT

A method for forming an EMI shielding gasket gasket. The gasket is a formed-in-place gasket which is deposited by an extruder. The gasket material is a fluent polymeric material having a conductive particles disposed therein. The fluent polymeric material is supplied to the extruder by a material supply system having several canisters and a mixing chamber. The fluent polymeric material is fed to a chamber in the extruder. Pressure is applied to the fluent polymeric material by a pressure supply system which includes a source of positive pressure and negative pressure, and a control module for selectively supplying positive pressure and negative pressure to the extrusion chamber.

14 Claims, 2 Drawing Sheets

U.S. PATENT DOCUMENTS

| | | | |
|---|---|---|---|
| 4,861,643 | 8/1989 | Scollard | 428/162 |
| 4,865,905 | 9/1989 | Uken | 428/220 |
| 4,869,954 | 9/1989 | Squitieri | 428/283 |
| 4,882,089 | 11/1989 | Iwaskow et al. | 429/242 |
| 4,900,877 | 2/1990 | Dubrow et al. | 174/35 GC |
| 4,915,985 | 4/1990 | Maxfield et al. | 427/126.6 |
| 4,931,326 | 6/1990 | Weil | 428/35.8 |
| 4,931,479 | 6/1990 | Morgan | 521/76 |
| 4,948,922 | 8/1990 | Varadan et al. | 174/35 GC |
| 4,977,295 | 12/1990 | Chin et al. | 17/35 GC |
| 5,008,485 | 4/1991 | Kitagawa | 17/35 GC |
| 5,045,635 | 9/1991 | Kaplo et al. | 174/35 GC |
| 5,047,260 | 9/1991 | Durand | 427/54.1 |
| 5,049,332 | 9/1991 | Ziemer et al. | 264/104 |
| 5,068,493 | 11/1991 | Benn, Sr. et al. | 174/35 GC |
| 5,107,070 | 4/1992 | Benn, Sr. et al. | 174/35 GC |
| 5,115,104 | 5/1992 | Bunyan | 174/35 GC |
| 5,137,766 | 8/1992 | Mazanek et al. | 428/68 |
| 5,202,536 | 4/1993 | Buonanno | 174/35 GC |
| 5,250,607 | 10/1993 | Comert et al. | 524/507 |
| 5,256,480 | 10/1993 | Inoue et al. | 428/331 |
| 5,284,888 | 2/1994 | Morgan | 524/93 |
| 5,362,428 | 11/1994 | Tsujino et al. | 264/40.5 |
| 5,473,111 | 12/1995 | Hattori et al. | 174/35 R |

METHOD FOR FORMING AN EMI SHIELDING GASKET

FIELD OF THE INVENTION

This invention relates to a method for forming a gasket and an apparatus for performing the method.

BACKGROUND OF THE INVENTION

EMI shielding gaskets are often used between mating housing components of electronic equipment. The gaskets provide protection against interference from electromagnetic energy, including radio frequency interference (RFI), and more broadly against all bands of interference commonly referred as electromagnetic interference (EMI). The use of EMI/RFI shielding gaskets at the interface between housing components and/or access panels helps to shield the device from sources of electromagnetic interference.

The EMI/RFI shielding gaskets include an electrically conductive element, such as a conductive filler, which is bound by a binding agent and helps to prevent external EMI from interfering with an electronic device having a shielding gasket. Additionally, such EMI shielding gaskets protect other adjacent electronic devices from EMI created by an electronic device having a gasket because the EMI/RFI is prevented from leaking out. The gaskets are used in a wide variety of devices such as cellular phones, notebook computers and other hand-held electronic devices. Given the small size of many of these devices, the housing covers, and the gasket material which is placed between the covers, must be similarly small. This leads to gasket manufacturing difficulties which must be overcome. There are several processes can be used to form gasket material in a desired shape. Examples of such processes include die cutting, compression molding or a process commonly known as form-in-place (FIP).

When an EMI gasket is die cut the gasket configuration is formed from a conductive sheet material which is then cut by a die to the desired shape, such as round, square, etc. Die cutting of an electrically conductive elastomer sheet stock can work in many instances in two plane (i.e. flat) applications. Die cutting an electrically conductive elastomer sheet for use as a gasket is often limited to gaskets having a larger width of gasket material. If the gasket desired is too narrow, often there is not enough material to make the gasket self-supporting. Because gasket material has a narrow width there is often no means to retain the gasket in the desired location prior to package assembly. Because there is no means to retain the gasket, it can fall out of the desired location. The die-cut gasket additionally is difficult to use for many applications, such as an EMI/RFI shielding gaskets for small hand held electronic devices. Die cutting gaskets can also result in a significant waste of sheet stock, thereby increasing the cost of gaskets. Further, the die cutting process exerts a significant amount of force on the sheet stock, and as a result, the sheet stock itself often needs to be fairly stiff and self-supporting. These characteristics are opposite to the desired characteristics of a EMI shielding gasket which should be soft and flexible.

An alternative method of producing an EMI shielding gasket is by compression molding. In this process the gasket is formed by placing uncured elastomeric material, which may contain an electrically conductive filler, into a specifically designed mold which is then subjected to a compressive force. After being formed in the mold, the material is cured to cause the elastomer to assume desired characteristics. This process often has the disadvantage of being relatively slow. Additionally the molding process often creates "flash" or boundary material which is scrap and must be removed prior to the gasket being used. Removing the flash can be a rather slow and labor intensive process, and therefore contributes to an increased cost per part. Further, a mold must be designed for each gasket design. This makes the process expensive and cost inefficient for all but large volume stock items. In addition, the molded gasket cross section may be so narrow that there is often no means to retain the gasket in the desired location prior to assembly. Thus the gasket tends to fall out prior to assembly and is difficult to use in many applications.

The development of a form-in-place EMI shielding gasket is a process where the EMI shielding gasket is extruded directly onto a substrate. Because the gasket is formed directly on the substrate, the waste created using the die cutting or compression molding is avoided. Furthermore, the FIP material usually forms a chemical bond to the substrate to retain the seal in the desired location. Such an FIP process requires a highly precise deposition of a bead of EMI shielding material onto a substrate. In prior art form-in-place deposition there is difficulty when the configuration of the substrate is such that the bead must be discontinued and subsequently continued. The process and apparatus of the prior art can create a "drool" of extruded material which has to be cut off after the bead was formed. This additional step to complete the formation of the gasket can complicate the fabrication of gaskets and can result in increased cost per part. In addition, difficulties have sometimes been encountered in designing form-in-place EMI gasket apparatus to rapidly and efficiently form small cross-section gaskets having desired uniformity with required electrical and mechanical properties.

SUMMARY OF THE INVENTION

It is an object of this invention to provide means and methods for accurately and rapidly depositing a bead of material on a substrate, which method can eliminate or control drool formation.

Still another object of this invention is to provide apparatus for enabling extrusion of an EMI gasket material to form a gasket, which apparatus comprises gas pressure control means for controlling the rate of extrusion through an extrusion head or orifice to the atmosphere.

It is a feature of this invention that gas pressure is used to force fluent polymeric material through an extrusion head. The pressure used to control the extrusion process varies from a negative gauge pressure to a positive gauge pressure.

According to the present invention, a process for forming a heat cured EMI shielding gasket is disclosed. The process comprises the steps of placing a fluent electrically conductive polymeric material in an extruder chamber, applying positive and negative air pressure to the chamber to control the extrusion of the material from the chamber as a bead of the material, the material forming an individual EMI gasket having desired cross-sectional areas. The bead is then heated to cure the bead and form the final EMI gasket.

In a preferred embodiment of the invention, the process for forming a FIP electrically conductive EMI shielding gasket forms a gasket having a cross-sectional area of preferably about 0.0002 in$^2$ to about 0.01563 in$^2$ and which gasket is formed by extruding a fluent organic polymeric material which has electrically conductive particles disbursed therein, with the polymeric material acting as a binder. The material is extruded through an extrusion head by the force of pressurized gas. The rate of extrusion is controlled by varying the air pressure applied to the surface of the material within the extrusion head. The organic polymeric material selected to be extruded preferably has a viscosity in the range of between 100,000 and 10,000,000 centipoise measured at 25° C. by a Brookfield Viscometer. As the material is extruded from the extrusion head, the head is moved relative to a substrate and a bead is formed on the substrate. The head can preferably move at a speed of from about 0.5 in/sec to about 6.0 in/sec with respect to the substrate during the formation of the bead. The bead is preferably formed with a precision of about 0.002 in. in height or width. The bead is precisely formed by varying the air pressure within a range of about 160 psi of positive pressure to about −0.9 atmospheres (atm) of negative pressure on fluent polymeric material to start and stop the bead being extruded.

According to the invention, an apparatus for extruding electrically conductive polymeric material is disclosed. The extruder has a chamber having a first and second end for holding fluent polymeric material, an extrusion head attached to the first end for extruding the fluent polymeric material through an extrusion orifice. The apparatus includes a source of positive gas pressure and a source of negative gas pressure connected to a control module. The control module has an outlet for selectively applying the positive and negative pressure to the chamber. A conduit which connects the outlet of the control module with the second end of the extruder chamber provides a selected amount of pressure to the second end of the extrusion head.

In a preferred embodiment of the invention, the apparatus comprises an extruder having a chamber for holding a supply of electrically conductive material having a viscosity from 100,000 through 10,000,000 centipoise. Preferably the material has a viscosity from 1,000,000 to 4,000,000 centipoise. An extrusion head is mounted on the extruder and is connected with the chamber for extruding the bead of EMI shielding material on the substrate, the head is movable with respect to the substrate. A vacuum pump provides a negative gauge pressure and a compressor provides a positive gauge pressure. Each are connected to a control module which is adapted to control the amount of air pressure acting on the EMI shielding material, The air pressure supplied to the extruder can be varied and is adjusted depending on the speed of the extrusion head, the amount of EMI shielding material in the extruder chamber, the flow rate characteristics of the material, and the viscosity of the EMI shielding material. The bead formation can be precisely controlled by varying the air pressure very rapidly. To terminate the bead formation, the pressure on the fluent polymeric material is rapidly reduced by connecting the conduit to negative gauge pressure. Once the bead has been formed on the substrate, the electrically conductive material is subjected to a curing process to cure the EMI shielding material.

The invention has broad applicability in form-in-place gasket applications, including but not limited to, application to the mating surfaces of cover pieces for electronic devices. Additionally, a gasket can be formed on a removable cover which is fit to an access port of an electronic device.

BRIEF DESCRIPTION OF THE DRAWINGS

Other features and advantages will become apparent from the following detailed description and from the drawings in which.

DETAILED DESCRIPTION

Figure 1:
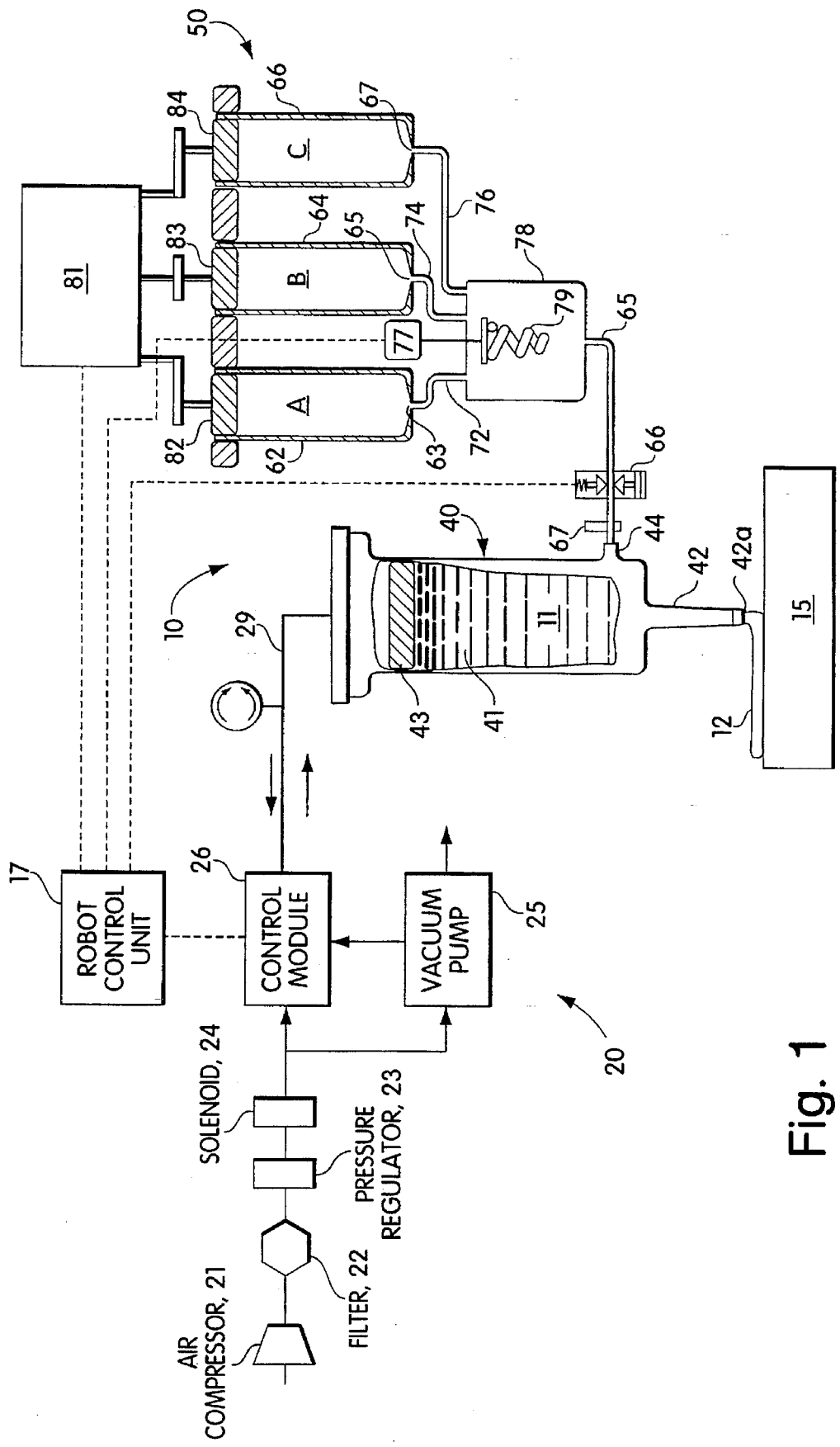
FIG. 1 is a schematic view of a preferred embodiment of an apparatus for forming a bead on the substrate.

FIG. 1 shows a schematic diagram of an apparatus indicated generally at 10, for forming a bead on a substrate which may be cured after forming. The apparatus has an extruder 40, a pressure supply system indicated generally at 20 and a material supply system indicated generally at 50.

The apparatus 10 provides a predetermined quantity of fluent polymeric material 11 in chamber 41 of extruder 40. The fluent polymeric material 11 is forced out of the extruder chamber 41 through an orifice 42a of an extrusion head 42 by air pressure. The air pressure is supplied by the pressure supply system 20 on the surface of the fluent polymeric material 11. The pressure supplied to the extrusion chamber 41 is adjusted by a control module 26 and can be varied. As the fluent polymeric material is forced through the extrusion head 42, the head moves along a predetermined path to form a bead 12 of polymeric material. The bead 12 which is formed along the desired path is cured to form the final EMI shielding gasket. The bead formation is terminated as where a continuous encircling gasket is formed, by reducing the pressure in chamber 41, preferably very rapidly, to a negative gauge pressure, which can be as low as −0.9 atm, or lower.

The extruder 40 is mounted on a robotic applicator which is a commercially available programmable X, Y, Z coordinate machine. In the preferred embodiment, the head moves relative to the position of a substrate 15, which is fixed in place during the extrusion process. A robotic control unit 17 controls the movement of the robot and the extrusion apparatus. A suitable robotic applicator is available from Robotics Inc. located in Ballston Spa, New York.

The material supply system 50 is designed to feed a predetermined amount of material into the extruder chamber 41. The material which is being extruded can be a hardenable, fluent polymeric material. By this definition is meant a polymeric material that has viscosity characteristics as described above, that can be readily extruded from an extrusion nozzle, and that is thermosetting, thermoplastic, or otherwise hardenable. The material can be a one-component elastomer or resin that is cured via heat, moisture, light, or chemical means. Any flexible setting resin is suitable for use in the invention, such a EPDM copolymers, silicone rubbers, fluorosilicone rubbers, urethane rubbers, nitrile rubbers, butyl rubbers, and mixtures thereof. Thermosetting or thermoplastic materials can be used. The selected material should be sufficiently viscous and/or form stable so that it does not slump, sag or run between the time of application and the time of curing. It may be in the form of a paste, a caulk, a gel or viscous fluid. Alternatively, when the material has a fast curing cycle or creates an initially stable material such as a gel or a skinned or foam structure upon application, the material as applied can be a relatively thin or non-viscous fluid.

An EMI gasket can be formed of a composition as taught by EP Patent Application 0326704A by using a two-component polymer system, one which is thermoplastic in nature, the other being thermoset when exposed to moisture or active hydroxyl groups. According to one embodiment the gasket includes the following three components. The first component is a primary polymer having end groups that are capable of chemically reacting with each other in the presence of moisture to form a derivative polymer having a longer average chain length than said primary polymer, such as an isocyanide capped polyester prepolymer. The second component is a noncross-linked elastomer that is not substantially chemically reactive with itself or with said first component in the presence of moisture, such as a block copolymer e.g. styrene-butadiene-styrene block copolymers. The third component is one or more electrically conductive fillers. The first, the second, and the third components are intimately mixed, and the composition, when maintained in the absence of moisture and other active hydrogen donor materials, form a readily extrudable and otherwise conventionally moldable or coatable thermoplastic composition but, upon exposure to moisture, becomes essentially thermoset.

Silicone-based polymeric materials suitable for use include, for example, material available from Dow Corning Corporation as SYLGARD™ 527 (Parts A and B). A suitable material can be mixed with one or more conductive fillers to form an EMI material.

The gasket may be rendered electrically conductive either through the use of a conductive filler incorporated into the elastomer base and/or the use of an electrically conductive outer layer formed over a core which may be conductive or nonconductive.

The fillers that are used to impregnate elastomers to make them electrically conductive are well-known in the art. Examples of these fillers include but are not limited to electrically conductive noble metal-based fillers such as pure silver; noble metal-plated noble metals such as silver plated gold; noble metal-plated non-noble metals such as silver plated copper, nickel or aluminum, for example, silver plated aluminum core particles or platinum plated copper particles; noble-metal plated glass, plastic or ceramics such as silver plated glass microspheres, noble-metal plated alumina or noble-metal plated plastic microspheres; noble-metal plated mica; and other such noble-metal conductive fillers. Non-noble metal-based materials are also suitable, including non-noble metal-plated non-noble metals such as copper-coated iron particles or nickel plated copper; non-noble metals, e.g. copper, aluminum, nickel, cobalt; non-nobel-metal-plated-non metals, e.g., nickel-plated graphite and non-metal materials such as carbon black and graphite combinations of the fillers to meet the desired conductivity, hardness and other parameters desired for a particular application.

The shape and size of the electrically conductive fillers is not critical to the present invention. The fillers may be of any shape that is generally used in the manufacture of conductive materials, including spherical, flake, platelet, irregular or fibrous (such as chopped fibers). In making gaskets in accordance with the invention it is preferred that the particle shape be spherical, substantially spherical or irregular. Flake or platelet shaped fillers are preferred when used in forming an outer conductive coating for the form-in-place gasket.

The particle size of the electrically conductive fillers can be within the range normally used for fillers in conductive materials. Generally the particle size of the one or more fillers is from about 0.250 μ to about 250 μ, preferably from about 0.250 μ to about 75 μ, and most preferably from about 0.250 μ to about 60 μ.

In accordance with a particularly referred embodiment of the invention, a polymeric thermal addition cure system, and an electrically-conductive filler, form an EMI shielding material which can be extruded and then heat cured. Polymeric thermal addition systems are known, and many such systems suitable for use in the invention are cured through reaction between functional groups on adjacent molecules, which functional groups and molecules can be the same or different. For example, the invention finds utility with a single species that is a polymer that can be cross linked, chain extended, or both. First and second species having first and second functional groups, respectively, can be reacted as well to cure and harden a fluent polymeric material. The first species is generally polymeric, and the second species a cross linker, although both the first and second species can be polymeric. The first and second species have adequate functionality such that a thermally-activated cross linking reaction results in hardening of the material to an extent that a gasket having mechanical properties desirable in an EMI shielding gasket results.

The first species is preferably a polymeric species of a size and structure that results in the material being fluent and extrudable, generally with a viscosity of from about 5,000 poise to about 10,000 poise at 25° C. The polymeric species can be a linear, branched, or radial homopolymer, random copolymer, or block copolymer, including polymeric species described above, and can include terminal reactive functional groups, internal (non-terminal) reactive functional groups, or both. The first species can include phenylmethylvinyl and divinylmethyl materials. According to a particularly preferred embodiment, the first species is a linear vinyl-terminated siloxane polymer, such as vinyl-terminated polydimethyl siloxane, and the second species is as hybrid cross-linker such as a hydride terminated siloxane, or a methylhydrodimethylsiloxane copolymer with 20–60% methyl hydrogen. A catalyst, such as a platinum catalyst, may be necessary to catalyze the addition cure reaction between the first and second species. Platinum catalysts are known to those of ordinary skill in the art, typically embodied as organoplatinum species.

Siloxane-based polymeric thermal addition cure systems are commercially available, for example from Dow Chemical and GE Silicone. Such systems are generally sold as a two-component system, the first component including a vinyl-containing siloxane and about 5–10 ppm platinum catalyst, and the second component containing a hydride functional siloxane and a vinyl-containing siloxane. The first and second components are mixed and heat cured, resulting in a form-stable material.

The polymeric thermal addition cure system becomes essentially thermoset upon exposure to a temperature of at least 85° C. for a period of time of at least 30 min. Typically, temperatures of from about 85° C. to about 180° C. are employed, and heat is applied to the system for period of time ranging from about 30 minutes to about 160 min. Preferred systems are cured at about 150° C. for about 30 minutes, at about 120° C. for about 60 minutes, or at about 85° C. for about 120 minutes. Those of skill in the art can adjust the time and temperature of curing to suit a particular system. For example, if a temperature as high as 250° C. is used, the curing time may be as short as 1–5 minutes.

Preferred polymeric addition cure systems, such as siloxane-based systems, will adhere to a substrate upon which they are cured without the use of a primer. Substrates to which the system will adhere when cured thereon include plastics, metals, ceramics, silica, and the like.

In accordance with the invention, an electrically-conductive material is mixed with the first and second components of a two-component thermal addition cure system, and when the components are mixed and heat cured, a form-stable EMI shielding material results.

According to a particularly preferred embodiment of the invention, a method involves providing several pre-mixed components and mixing together the components to form EMI shielding material that can be extruded to form a gasket. The components are formulated such that predetermined amounts of each are blended together prior to extrusion, where the predetermined amounts are conveniently deliverable and blendable. For example, the components can be prepared such that a ratio of the first to the second of approximately 1:1 can be blended prior to extrusion.

A three-component system is provided that includes one pre-mixed component that can include the first species, the electrically-conductive filler, and the catalyst. A second component can include the first species, the second species, and the electrically-conductive filler. A third component can be provided that includes one or more additives such as polymeric microspheres, viscosity-controlling silicone fluid, fumed silica, catalyst, cure inhibitor, or the like. The method can involve mixing the first and second components together and then adding the third component prior to extrusion or mixing the first component with the third component, then adding the second component prior to extrusion.

According to another embodiment of the invention, a two-component system is provided that includes one premixed component that can include the first species, the second species, the electrically-conductive filler, the catalyst, and an inhibitor. The inhibitor prevents reaction between the first and second species at room temperature, but at curing temperatures is volatilized, allowing reaction between the first and second species. A second component can include one or more of the additives above. If additives are not needed, a one-component system may be used.

The selected resin should form a soft, resilient, compression set resistant gasket even with the addition of relatively highloadings of conductive fillers, if used. Preferably the final gasket is elastomeric and can have a continuous encircling configuration. When the polymeric material is in its fluent state, it preferably can be compressible to about 95% of its uncompressed volume when positive gauge pressure in the operational range of the machine is applied. When the polymeric material is compressible, part of the pressure applied to the extruder chamber during the extruding operation is absorbed by the material as it compresses. This results in a lag time and a sluggish response to the application of pressure in the extrusion process. The sluggish response further complicates the termination of the extrusion of the bead because of the energy which is stored in the compressed material. Of course, the process and apparatus of the invention can be practiced with an incompressible fluent polymeric material.

The fluent polymeric material preferably has the following representative flow rate characteristics as described below, when the material is extruded through an 0.033 in. orifice (18 gauge needle), at 20 psi the range of flow rates are (depending on changes in viscosity) 0.03–014 gm/min; at 40 psi the range of flow rates are 0.05–0.25 gm/min at 60 psi, the range of flow rates are 0.10–046 gm/min. When the material is extruded through a 0.054 in orifice (15 gauge needle) at 20 psi the range of flow viscosity rates were 0.06–0.49 gm/min while at 40 psi the range is 0.19–1.25 gm/min and at 60 psi the range is 0.36–2.62 gm/min.

The viscosity of the fluent polymeric material is between about 100,000 and about 10,000,000 centipoise. Preferably, the range is between 1,000,000 and 4,000,000. The viscosity is measured by a Brookfield Viscometer (RV Series), Hellopath stand with an "F" T-spindle 1–2.5 rpm. The viscometer is available from Brookfield Engineering Labs, Inc., Stoughton, Mass.

The Polymeric Material Supply System

The material can be supplied in three constituent parts which are mixed prior to extrusion. As described above, the components could have a limited shelf life and provide the highest quality bead when mixed shortly before the extrusion process. The components can be mixed on-line, that is, supplied to the extrusion apparatus in component parts and subsequently mixed in the apparatus. Alternatively, the components can be mixed off-line and then supplied to the extrusion apparatus ready to be extruded. Alternatively, the invention can be practiced with a single component fluent material which is inserted into the extrusion chamber.

As shown in FIG. 1, constituent material A, B and C are inserted into elongated, cylindrical chambers 62, 64 and 66, respectively. As an example of a three-constituent combination which would be combined to form the fluent polymeric material, A can contain a resin, B can contain a cross-linking agent, and C can contain one or more additives such as polymeric microspheres, silicone fluid, cure inhibitor, catalytic cure accelerator, fumed silica, colorant, or the like, carried in a suitable carrier including the resin or the cross-linking agent. Resins and cross-linking agents, such as siloxane-based resins and cross-linking agents, are known. A proportioning pneumatic cylinder 81 controls the motion of three rams 82, 83, 84 which sealingly slide within one end of each of the chambers 62, 64, 66, respectively. The proportioning cylinder 81 is controlled by the robotic control unit 17. Each ram is adapted to individually and independently slide within the cylinders to force a predetermined amount of component material out of the cylinder through orifices 63, 65, and 67 of cylinder 82, 83 and 84 respectively. Conduits 72, 74 and 76 connect each orifice 63, 65 and 67, respectively, to an elongated, cylindrical mixing chamber 78.

The constituent materials are then mixed in the mixing chamber 78 by a dynamic mixer 79 which in the preferred embodiment is an elongated helical screw. The dynamic mixer 79 is rotated by a motor 77 which is controlled by the robotic control unit 17. The mixing chamber 78 is connected to the extruder chamber 41 by a conduit 65. A valve 66 is disposed along conduit 65 to control the flow of material such that a predetermined amount of polymeric material is allowed to fill the chamber. The valve 66 is shown to be a pinch valve, of course one skilled in the art will recognize the wide variety of valves which are suitable for the purpose of controlling the flow of fluid through conduit 65 and for making sure a predetermined amount of fluent polymeric material flows into the chamber 41. A pressure transducer 67 located between the valve 66 and the cylinder 41 operates to monitor the pressure in the cylinder.

In a second mode of operation of the extruding apparatus the material 11 is formed from only two combined components. The two components are placed in cylinders such as 62 and 64 and then are mixed in the mixer chamber 78 by the dynamic mixer 79. When two components are used to form the fluent polymeric material, one component could be a mixture of resin and cross-linker and the other component could be catalyst, or one component could be a resin and the other a mixture of the cross-linker and the catalyst, or other formulation.

A third mode of operation of the extruding apparatus is a single component system. In this mode of operation, the single component is placed into a single cylinder and fed through the conduit 65 directly. In some cases it may be advantageous to feed the single component material through the mixer chamber 78 and mixed by the dynamic mixer 79 to ensure a homogenous mixture is fed to the extruder chamber 41.

The Extruder

The cylindrical extruder chamber 41 is adapted to hold fluent polymeric material. An air conduit 29 is fluidly connected to the upper portion of the cylinder and provides air pressure to the chamber 41. A cap 43 is slidingly received in the chamber and separates the pressurized air from the fluent polymeric material, thus keeping the fluent polymeric material free from foreign particles which may be in the air. The chamber also has an inlet 44 through which the fluent material flows from the conduit 65. In the preferred embodiment of FIG. 1, the extruder chamber 41 has a volume of about 30 cc.

At the lower end of the extruder 40 is the extrusion head 42 which has an orifice 42a through which the material is extruded to form the bead. The extrusion head, also known as a needle, has an orifice diameter of about 0.025 in. to about 0.090 in. Preferably, the diameter is about 0.033 in. The needle has a decreasing diameter along the axial length towards the orifice to enhance the material flow properties though the needle.

The Pressure Supply System

Again with reference to FIG. 1, the extrusion of the polymeric material 11 is controlled by the pressure supply system 20 which is adapted to provide both a positive and negative pressure to the extrusion chamber 61. An external source such as an air compressor 21, provides a source of positive pressure for the system. Any commercially available air compressor which supplies 160 psi of pressure is suitable for use, The air compressor is fluidly connected to a gas pressure regulator 23 which controls the pressure of the air supplied to the system. This pressure regulator 23 is used to provide broad control of the pressure supplied to the system, and generally does not change during the operation of the extrusion process. An air filter 22 is disposed between the air compressor and the pressure regulator to clean the air which is supplied to the system. A solenoid valve 24 is provided on the pressure line to isolate the pressure from the system at desired intervals during the bead extrusion process.

A vacuum pump 25 is provided in the system 20 to supply a negative pressure or vacuum to the extrusion chamber at predetermined intervals in the extrusion process, for example, when the bead formation is to be terminated as after formation of a continuous encircling bead which is to be cured to form as gasket. The vacuum pump is commercially available and provides a vacuum of about −0.9 atm. The vacuum pump is powered using the pressure from the air compressor in a manner well known to those skilled in the art.

A control module 26 receives both the positive pressure supplied by the air compressor 21 and the negative pressure supplied by the vacuum pump 25 and supplies a selected pressure to the extruder chamber 41 through a fluid line 29. A pressure gauge (not numbered) is disposed between the control module and the extruder chamber. The control module responds to a signal from the robot control panel and is a 24 volt DC binary pressure converter. The control module used in the preferred embodiment is an ABR Regulating valve which is available from Parker Hannifin, of Cleveland, Ohio. The pressure supplied to the extrusion chamber by the control module varies at 25 increments of positive pressure and 25 increments of negative pressure. The response time of the control module is 20 milliseconds which facilitates a quick response to a start or a stop command from the robot control unit.

Because both the control module 26 and the position of the extruder head 42 are controlled by the robot control unit 17, the control unit can vary the pressure applied to the material by the pressure control module while varying position or speed of the extruder head. For example, the command module can reduce the pressure applied to the material 11 in the extruder chamber 41, when the robotic applicator head slows down to apply a bead to a curve on the substrate. Thus, the flow of material out the extrusion head is able to correspondingly slow down, Additionally, the control module can control the pressure to preferably maintain constant desired extrusion pressure while accounting for variations in the required applied pressure due to the diminishing volume of the material in the cylinder 42 as the material is being extruded. Typically, the force required to extrude the fluent polymeric material out a needle of 0.033 in. diameter is between 40 and 160 psi.

When it is desired to terminate the formation of a bead the control module 26 reduces the pressure supplied to the fluent polymeric material 11 by connecting the vacuum pump 25 to the chamber. The control module can control the amount of negative gage pressure in 25 increments varying from no vacuum to the maximum vacuum available from the vacuum pump. The vacuum pump enables the bead termination to be controlled with great precision.

Having described the apparatus, a representative method of operation is now provided. The constituent components of the fluid polymeric are placed in the chambers 62, 64 and/or 66. For example, chamber 62 can contain a first pre-mixed component including a vinyl-terminated siloxane polymer, a catalyst, and electrically-conductive particles. Chamber 64 can contain a second pre-mixed component including a hydride-terminated siloxane polymer and vinyl-terminated siloxane polymer, and electrically-conductive particles. Exemplary first and second components, absent the electrically-conductive particles, are available commercially from Dow Corning as SYLGARD™ 527A and 527B. Chamber 66 can contain one or more additives as described above (microspheres, fumed silica, viscosity-adjuster, electrically-conductive particles, cure inhibitor, cure accelerator, or the like).

A proportioning pneumatic cylinder responds to a command signal supplied by the robot control unit to actuate rams 82, 83, and/or 84 to slide into the chambers 62, 64 and/or 66 so that a predetermined amount of material is fed into the mixing chamber 78 and mixed in a dynamic mixing process by a mixer 79, to form a hardenable, fluent polymeric material which can be cured, by heat according to a preferred embodiment, after extrusion.

The material then flows through conduit 65 when the valve 66 is opened by the robotic control unit. The valve 66 controls the amount of material which flows into the extruder chamber 41. When a predetermined amount of material is fed into the extrusion chamber 41, the valve 66 is shut. Typically, the amount of material which is fed into the extruder chamber 41 is enough for at least several minutes of operation of the machine. Once the valve 66 is shut the pressure from the air compressor is supplied to the extrusion chamber by the operation of the command module 26. As the pressure is increased a sufficient amount so that the material is extruded out the extruder head, the extruder head simultaneously moves along the predetermined path where a continuous encircling bead is to be formed. As indicated above, the speed of the extruder head can be varied while simultaneously varying the pressure behind the pressure in the extrusion chamber by the control module 26, This provides for precise control of the bead formation process.

Figure 2:
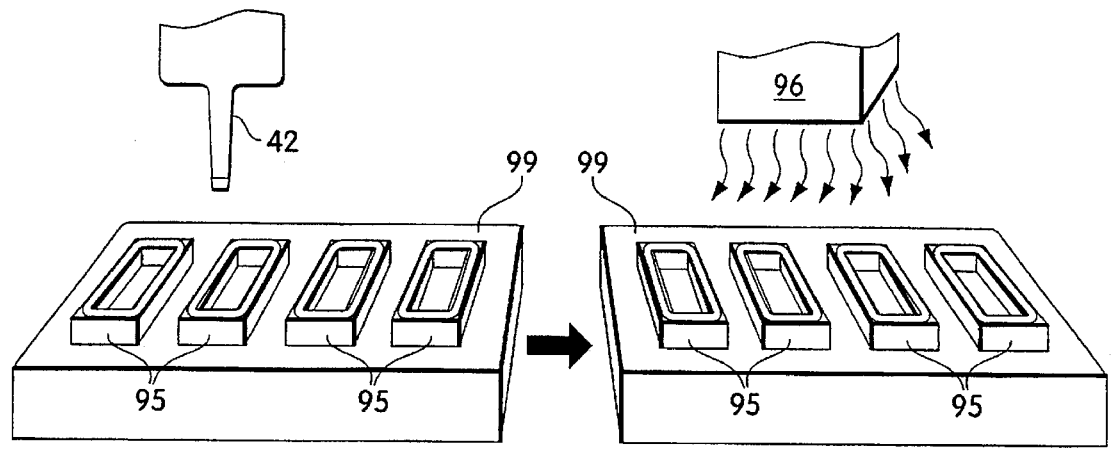
FIG. 2 is a schematic representation of the process of forming a bead on a substrate and heat curing the bead.

As shown in FIG. 2, several separate substrates or parts 95 can be located on a pallet 99 and the robotic extrusion head 92 can be programmed to form a bead in predetermined locations along the edge of the individual parts. Four parts 99 are shown on the pallet 95 in FIG. 2. It should be recognized that as few as one, or as many parts which can conveniently fit onto a pallet, can be used. In the current design, the pallet remains stationary while the bead is being extruded by the extrusion head. It should be recognized that an alternative design could be to program the tables so that the pallet moves along a predetermined path so that a stationary head can deposit the bead on the parts 95. The parts 95 are shown in FIG. 2 as having a bead only in the X and Y direction, it should be recognized that the device can deposit a bead along the X, Y and Z axis. After each part on the pallet has been supplied with a bead, the pallet is moved to an oven 96 for heat curing. Typically, the heat cure process will be of a temperature 150° C. for about a half hour. The range of cure temperatures could be as low as 7520 C. and as high as 180° C.. After the heat curing, the parts are subsequently cooled.

Figure 3:
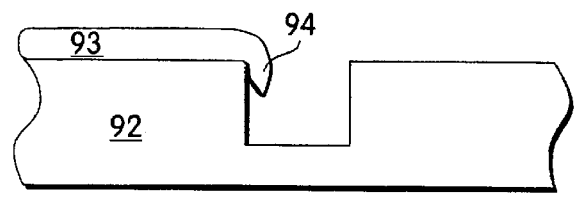
FIG. 3 is a representation of a FIP bead formed by a prior art device showing excess material or drool in the bead.

FIG. 3 shows the bead 93 formed on a substrate 92 by a method of the prior art. The "drool" or drip 94 is formed at the termination of the bead 93 because the bead formation process lacks the control of the present invention.

Having described and illustrated this invention in detail, those skilled in the art upon reading the description that numerous modifications may be made without departing from the spirit of the invention. Therefore, it is not intended that the scope of the invention be limited to the specific embodiments described. For example, as indicated above, the extruder head can be made to stay stationary and the table can move along the predetermined path to supply the bead on the substrate. The various chambers, mixers, valves and other components can vary greatly in size, shape and structure for specific applications as will be known to those skilled in the art. While the bead formed can be heat cured when certain materials are used, in some cases the oven can be eliminated and moisture curing used with certain material. Moreover the use of positive and negative gas pressure activation and stopping of any extruded bead of gasket material can be carried out with a wide variety of materials.

What is claimed is:

1. In a process of forming a heat cured EMI shielding gasket, the improvement comprising:

placing a fluent electrically conductive polymeric material in an extrusion chamber applying positive and negative air pressure successively to said chamber to control extrusion from said chamber of a bead of said material to form individual EMI gaskets having desired cross-sectional areas, and heating said bead to cure said bead.

2. A process for forming a bead of fluent polymeric material carrying electrically conductive particles on a substrate, which bead acts to provide an EMI shielding gasket, said fluent polymeric material being extruded from an extruder head through an orifice by exerting pressure on the fluent polymeric material, said process comprising the steps of:

supplying said fluent polymeric material to said extrusion head, forming a bead of said polymeric material on said substrate by increasing pressure on said fluent polymeric material to cause said fluent polymeric material to flow out the extrusion head while simultaneously moving said extrusion head relative to said substrate, and varying the amount of pressure while varying the speed of the relative motion between the extrusion head and the substrate to maintain a desired cross-section bead formation, and reducing the pressure to a negative gauge pressure to discontinue the bead formation.

3. The process according to claim 2 wherein said pressure is gas pressure.

4. The process according to claim 3, wherein the fluent polymeric material is supplied to the extrusion head by the steps of:

providing a first container holding a first component of the fluent polymeric material, providing a second container holding a second component of the fluent polymeric material, mixing the first and second components prior to supplying the fluent polymeric material to the extrusion head.

5. The process according to claim 4, wherein the mixing step is a dynamic mixing step performed by a screw-type mixer.

6. The process according to claim 3, wherein said gas is pressure controlled by a control module having a series of predetermined settings from less than about −0.9 atmosphere to a pressure of about 160 atmospheres.

7. The process according to claim 3 wherein said bead is formed on said substrate at a rate of movement of the extrusion head with respect to the substrate of between about 0.5 inches per second to about 6 inches per second.

8. The process according to claim 3 further including heat curing the fluent polymeric material after the bead is deposited on the substrate to form an electrically conductive EMI gasket.

9. The process according to claim 3 wherein said fluent polymeric material used to form the bead is an elastomer having electrically conductive particle fillers.

10. The process in accordance with claim 2 wherein said substrate is mounted on a support so that said extrusion head and said substrate can be moved with respect to each other along XYZ axis during said forming step.

11. A process of forming an electrically conductive shielding gasket having a cross sectional area of from about 0.0002 in$^2$ to about 0.01563 in$^2$ by extruding fluent polymeric material having electrically conductive particles therein through an extrusion head having an extrusion orifice with the use of air pressure variation applied to a surface of said fluent polymeric material within said extrusion head said process comprising:

selecting said fluent polymeric material having a viscosity between 100,000 and 10,000,000 centipoise and positioning said fluent polymeric material on a first side of said extrusion orifice, extruding said fluent polymeric material from said extrusion head by applying gas pressure thereto to cause a bead of said fluent polymeric material to be extruded onto a substrate while moving said substrate with respect to said extrusion head at a speed of from 0.5 in/sec to 6.0 in/sec said bead being formed having an accuracy of about ±0.002 in., and, varying said air from a positive gauge pressure to a negative gauge pressure, on said fluent polymeric material to alternately start and stop the bead being extruded.

12. The process in accordance with claim 11 wherein said fluent polymeric material is compressible, and heating said bead to cure said fluent polymeric material and adhere said bead to said substrate and form an EMI shielding gasket having good mechanical and electrical properties.

13. The process in accordance with claim 11 wherein said fluent polymeric material used to form the bead is an elastomer having electrically conductive particle fillers.

14. A process for forming a bead of fluent polymeric material carrying electrically conductive particles on a substrate, which bead acts to provide an EMI shielding gasket, said fluent polymeric material being extruded from an extruder head through an orifice by exerting air pressure on the fluent polymeric material, said process comprising the steps of:

providing at least first and second containers holding, respectively, first and second components of the fluent polymeric material, each of said containers being coupled in fluid communication with the extrusion head via a conduit;

admixing within the conduit a portion of the first and second components from the first and second containers to form the fluent polymeric material;

delivering the fluent polymeric material through the conduit to the extrusion head; and supplying air pressure on a surface of the fluent polymeric material to cause the fluent polymeric material to flow out the extrusion head; and moving one of the extrusion head or substrate relative to the other forming a bead of said polymeric material on said substrate.

* * * * *